United States Patent
Sandhu

(10) Patent No.: US 12,057,841 B1
(45) Date of Patent: Aug. 6, 2024

(54) PULSE SKIPPING CIRCUIT FOR WIRELESS SENSORS

(71) Applicant: Nuvoton Technology Corporation, Hsinchu (TW)

(72) Inventor: Bal S. Sandhu, Fremont, CA (US)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 18/173,822

(22) Filed: Feb. 24, 2023

(51) Int. Cl.
| | |
|---|---|
| *H03K 5/00* | (2006.01) |
| *H03K 3/037* | (2006.01) |
| *H03K 5/1252* | (2006.01) |
| *H03K 5/133* | (2014.01) |
| *H03K 5/135* | (2006.01) |
| *H03K 21/00* | (2006.01) |

(52) U.S. Cl.
CPC ......... *H03K 3/0377* (2013.01); *H03K 5/1252* (2013.01); *H03K 5/133* (2013.01); *H03K 5/135* (2013.01); *H03K 21/00* (2013.01)

(58) Field of Classification Search
CPC .... H03K 3/0377; H03K 5/1252; H03K 5/133; H03K 5/135; H03K 21/00; H03K 23/00
See application file for complete search history.

(56) References Cited

U.S. PATENT DOCUMENTS

| | | | | |
|---|---|---|---|---|
| 10,985,761 | B1 * | 4/2021 | Lin | H04L 69/324 |
| 11,152,943 | B1 * | 10/2021 | Bowles | H03K 21/026 |
| 2015/0355671 | A1 * | 12/2015 | Coutts | G06F 1/206 |
| | | | | 713/503 |
| 2016/0112057 | A1 * | 4/2016 | Park | H03M 1/506 |
| | | | | 341/172 |
| 2022/0209756 | A1 * | 6/2022 | Goenka | H03K 19/20 |

* cited by examiner

*Primary Examiner* — Tuan T Lam
(74) *Attorney, Agent, or Firm* — Kilpatrick Townsend & Stockton LLP

(57) ABSTRACT

A circuit receives an input clock pulse signal characterized by a first frequency and a first pulse width, and produces an output pulse signal characterized by a second frequency that is half of the first frequency and a second pulse width that is equal to the first pulse width. The circuit also includes a first D-flipflop, a first inverter, a first Schmitt trigger, and a first AND gate. The first D-flipflop includes a clock input terminal for receiving the input clock pulse signal and an output terminal for producing a first data output. The first inverter couples the output terminal and a data input terminal of the first D-flipflop. A first Schmitt trigger receives the input clock pulse signal and provides a first delayed input clock signal. The first AND gate receives the first data output and the first delayed input clock signal, and provides the output pulse signal.

20 Claims, 8 Drawing Sheets

PULSE SKIPPING CIRCUIT FOR WIRELESS SENSORS

BACKGROUND

The invention relates to the field of electronic circuits. More particularly, embodiments of the present invention are related to pulse generators in the field of low power circuits. Some embodiments described herein can be applications in wireless sensor devices. However, the circuits and methods described here can also be used in other low-power applications.

FIG. 1 illustrates an example of a sensor circuit sleep-wake cycle using pulse-sampling intervals. In the example shown in FIG. 1, the horizontal axis is time, and the vertical axes show power consumption. It can be seen that, in a sleep mode, the power consumption level 101 is low. In a wake and sense mode, the power consumption 102 is high. Further, during a period of processing and transmitting, the power consumption 103 is high and variable. To maximize battery life, wireless sensor nodes are heavily duty cycled. Most of the time, the sensor can be in sleep mode to save battery power.

FIG. 2A is a simplified schematic diagram 200 illustrating a trigger pulse generating circuit that can be used in a sensor circuit. FIG. 2A also shows waveforms of the input and output. The example in FIG. 2A shows a delay element and an XOR circuit to generate trigger pulses. FIG. 2B is a waveform diagram illustrating the input signal, a delayed input signal, and the output of the XOR circuit for generating the trigger pulses. The pulse width is on the order of picoseconds. The trigger pulse generating circuit produces two output pulses in a period of the input signal. However, the challenge with this circuit is creating a robust delay element and wide-enough pulse delay in the propagating signal.

Therefore, improved methods and systems that address some of the limitations described above are desired.

BRIEF SUMMARY

Embodiments of the invention provide a pulse skipping circuit that can be implemented to wake the sensor to sample workload at specific intervals for low-power application. Additional variations and applications based on the pulse skipping circuit are also described to provide a dual-mode clock generating circuit and a non-overlapping clock pulse generating circuit.

Various embodiments described here can be used in many low power applications. For example:
 (1) Low power circuits where a clock is slowed down after some event is detected (e.g., temperature alarm);
 (2) During chip power up where the clock starts with pulse skipping until there is a certain time-out from a counter to keep the power-up current low; and
 (3) Some form of pulse modulation in analog circuits.

In some embodiments, a circuit includes a first pulse skipping circuit for producing a first output pulse signal. The first pulse skipping circuit includes an input node for receiving an input clock pulse signal characterized by a first frequency and a first pulse width and a first output node for providing a first output pulse signal characterized by a second frequency that is half of the first frequency and a second pulse width that is equal to the first pulse width. The circuit includes a first D-flipflop, a first inverter, a first Schmitt trigger, and a first AND gate. The first D-flipflop includes a data input terminal for receiving a first data input, an output terminal for producing a first data output, and a clock input terminal coupled to the input node for receiving the input clock pulse signal from the input node. The first inverter couples the output terminal of the first D-flipflop and the data input terminal of the first D-flipflop. The first Schmitt trigger receives the input clock pulse signal from the input node and provides a first delayed input clock signal. The first AND gate receives the first data output of the first D-flipflop and the first delayed input clock signal from the first Schmitt trigger, and provides the first output pulse signal.

In some embodiments of the above first pulse skipping circuit, the first D-flipflop is a set-reset D-flipflop that further comprises a reset terminal for receiving a first reset signal, a set terminal for receiving a first set signal. In some embodiments, the first Schmitt trigger comprises a hysteresis and two thresholds configured to reduce input signal noise effect. In some embodiments, the first data output is characterized by a frequency that is half of the first frequency and a pulse width that is twice the first pulse width.

According to some embodiments, the above circuit also includes a multiplexer to produce a dual-mode clock pulse signal. The multiplexer includes a first input for receiving the first output pulse signal, a second input for receiving the first delayed input clock signal from the first Schmitt trigger, and an output for providing the dual-mode clock pulse signal in response to a select signal. If the select signal is in a first state, the dual-mode clock pulse signal is characterized by the first frequency, and the first pulse width. If the select signal is in a second state, the dual-mode clock pulse signal is characterized by a second clock frequency that is half the first frequency, and a second clock pulse width that is equal to the first pulse width.

In some embodiments of the above dual-mode clock pulse signal, when the select signal is in the first state, the circuit is in an active state. When the select signal is in the second state, the circuit is in a sleep state.

According to some embodiments, the above circuit also includes a second pulse skipping circuit for producing a second output pulse signal. The second pulse skipping circuit includes a second D-flipflop, a second inverter, a second Schmitt trigger, and a second AND gate. The second D-flipflop has a data input terminal for receiving a second data input data, an output terminal Q for producing a second data output, and a clock input terminal coupled to the first Schmitt trigger for receiving the first delayed input clock signal. The second inverter couples the output terminal of the second D-flipflop and the data input terminal of the second D-flipflop. The second Schmitt trigger receives the first delayed input clock signal from the first Schmitt trigger and provides a second delayed input clock signal. The second AND gate receives the second data output of the second D-flipflop and the second delayed input clock signal from the second Schmitt trigger, and provides the second output pulse signal. The first D-flipflop and the second D-flipflop are configured such that the first data output of the first D-flipflop and the output of the second D-flipflop are characterized by opposite states. The first output pulse signal and the second output pulse signal are non-overlapping signals.

In some embodiments of the above circuit for producing non-overlapping signals, a delay time between a consecutive first output pulse signal and a second output pulse signal is equal to the first pulse width. In some embodiments, the second output pulse signal is characterized by the second frequency that is half of the first frequency and the second pulse width that is equal to the first pulse width. In some embodiments, the first output pulse signal and the second output pulse signal are aligned with alternate input clock pulse signals, respectively.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label by a second label that distinguishes among the similar components. If only the first reference label is used in the specification, the description can be applicable to any one of the similar components having the same first reference label irrespective of the second reference label

DETAILED DESCRIPTION OF THE INVENTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will convey the scope. Among other things, the features of the disclosure can be facilitated by methods, devices, and/or embodied in articles of commerce. The following detailed description is, therefore, not to be taken in a limiting sense.

Figure 1:
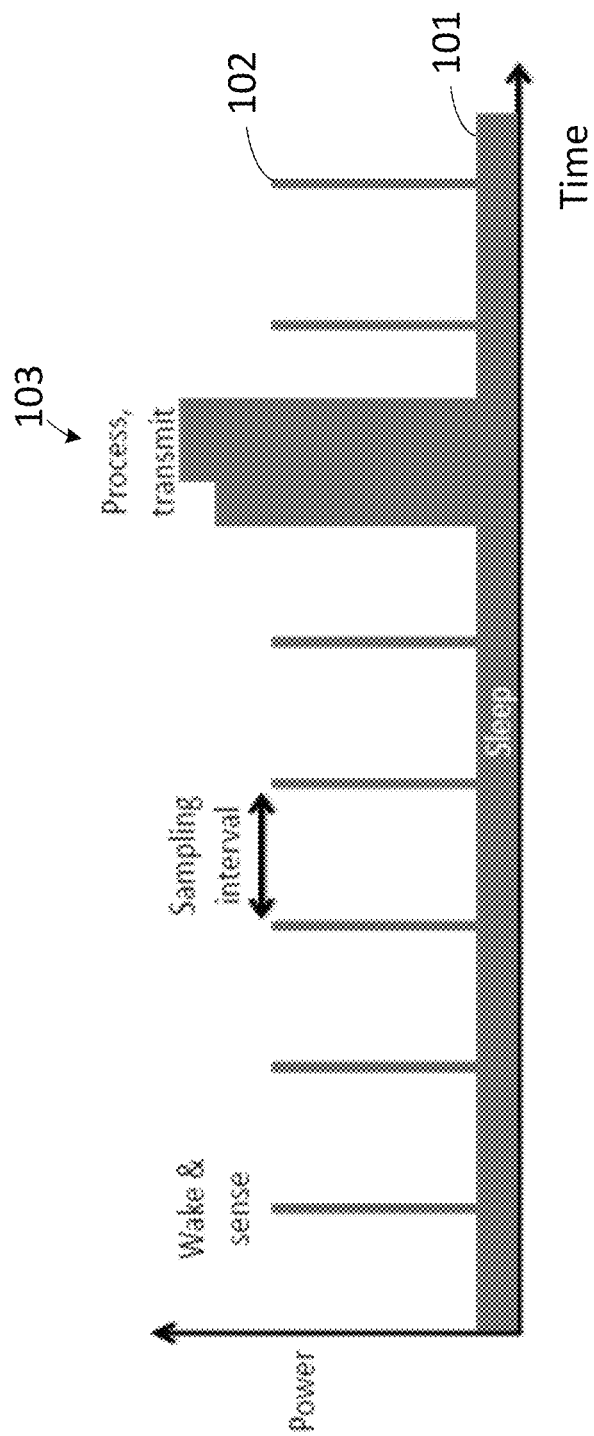
FIG. 1 illustrates an example of a sensor circuit sleep-wake cycle using pulse-sampling intervals.
Figure 2A:
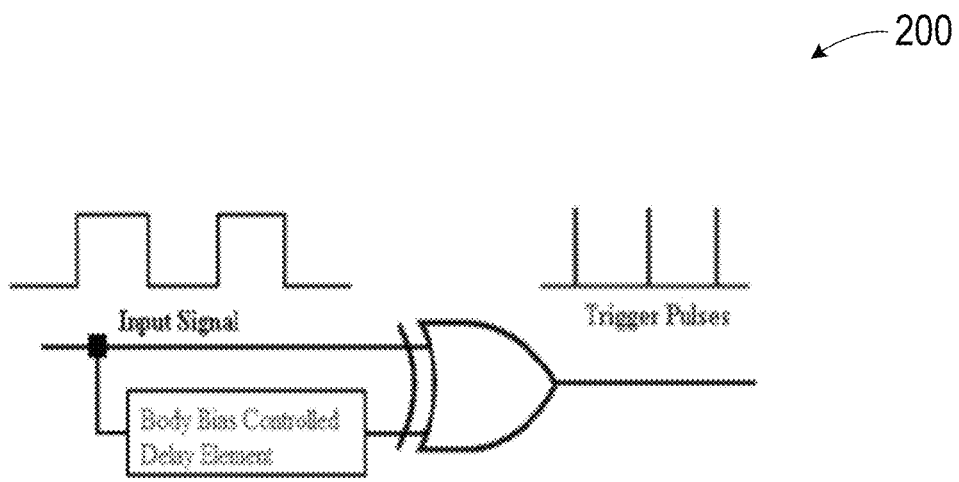
FIG. 2A is a simplified schematic diagram illustrating a trigger pulse generating circuit that can be used in a sensor circuit.
Figure 2B:
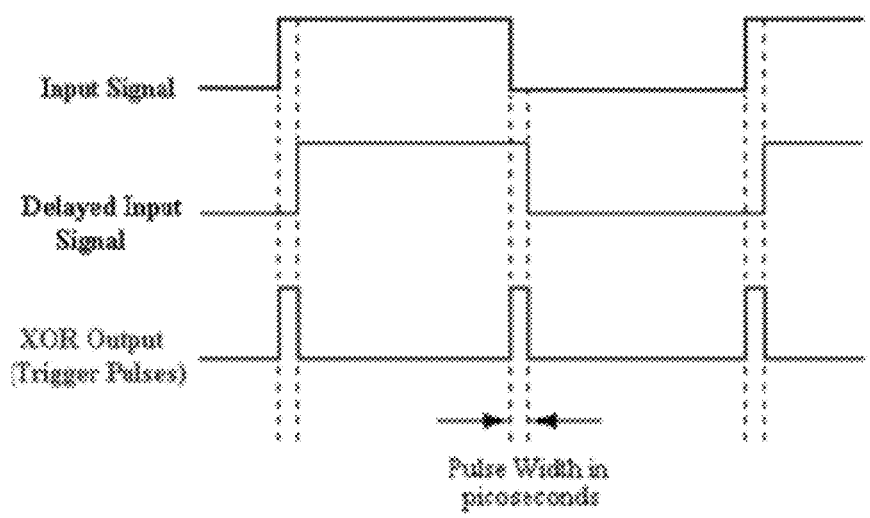
FIG. 2B is a waveform diagram illustrating the input signal, a delayed input signal, and the output of the XOR circuit of FIG. 2A for generating the trigger pulses.
Figure 3:
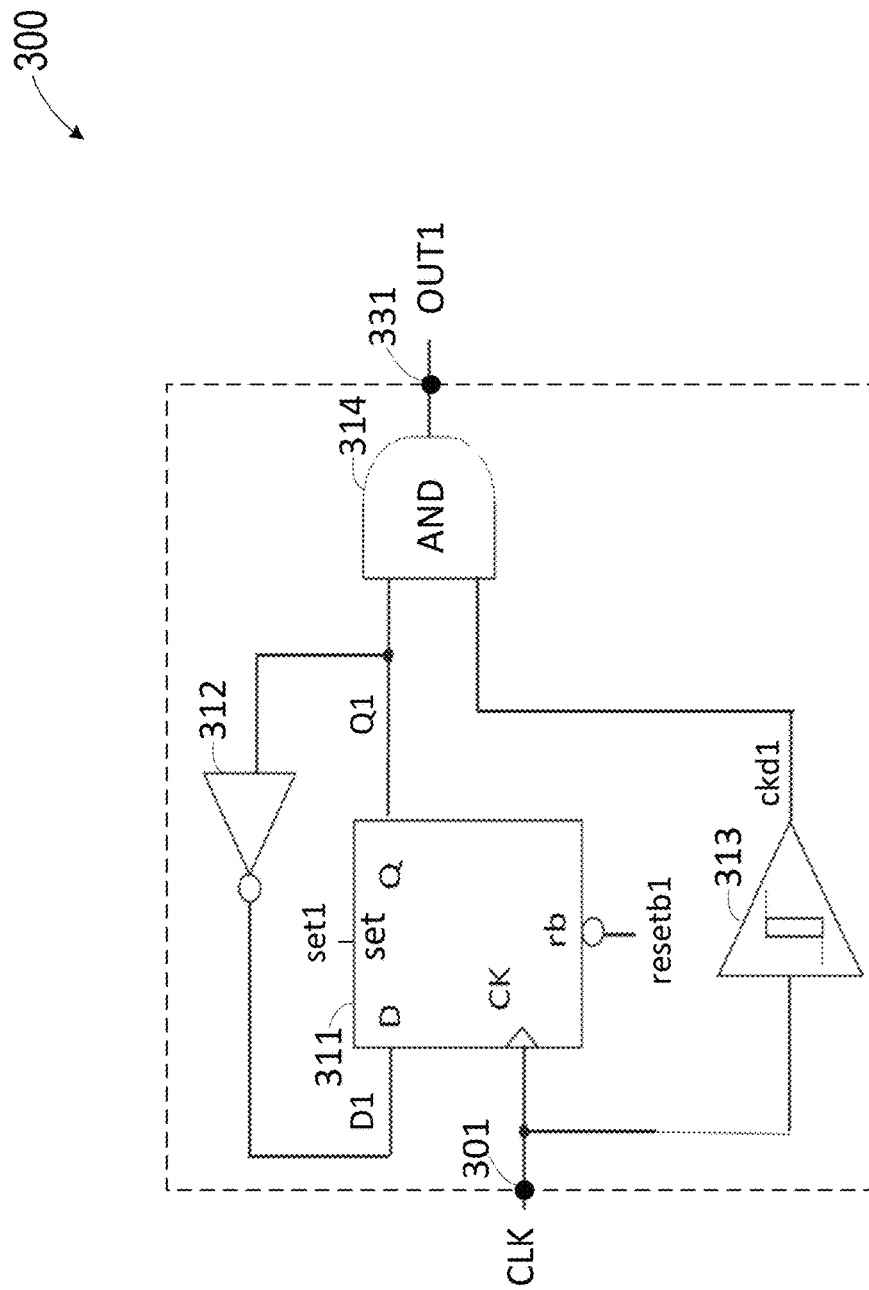
FIG. 3 is a simplified schematic diagram of a pulse skipping circuit, according to some embodiments of the invention.
Figure 4:
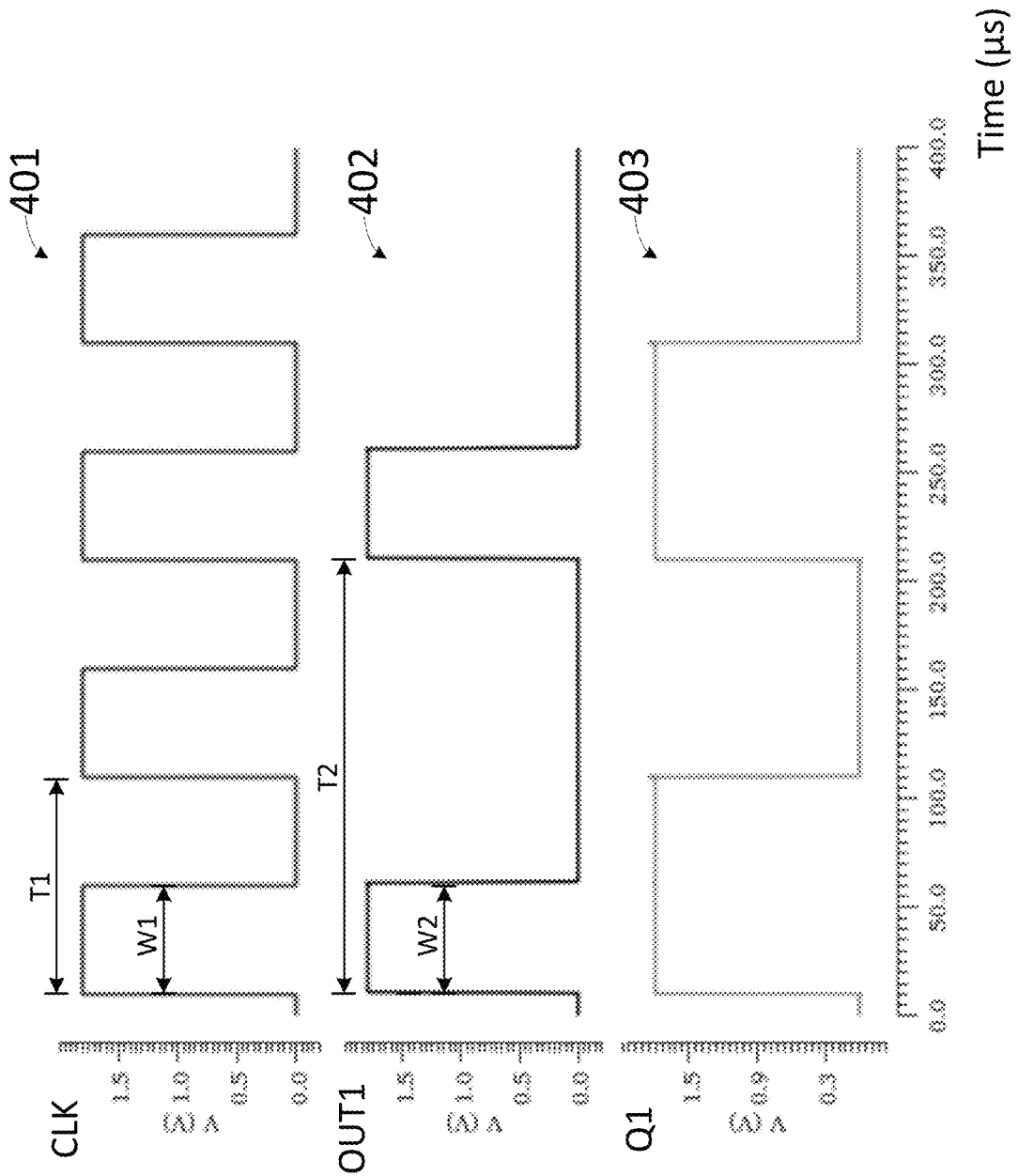
FIG. 4 is a waveform diagram illustrating the operation of pulse skipping circuit 300 in FIG. 3, according to some embodiments of the invention.

FIG. 3 is a simplified schematic diagram of a pulse skipping circuit, according to some embodiments of the invention. The operation of pulse skipping circuit 300 in FIG. 3 is explained with reference to the waveform diagram in FIG. 4. As shown in FIG. 3, pulse skipping circuit 300 includes an input node 301 for receiving an input clock pulse signal CLK characterized by a first frequency (1/T1, where T1 is a first period), and a first pulse width W1. Pulse skipping circuit 300 also includes a first output node 331 for providing a first output pulse signal OUT1 characterized by a second frequency (1/T2, where T2 is a second period) that is half of the first frequency (1/T1) and a second pulse width W2 that is equal to the first pulse width W1. Examples of input clock pulse signal CLK and first output pulse signal OUT1 are shown in FIG. 4.'

It is noted that this description includes statements such as "a first quantity is equal to a second quantity" or "a first quantity is the same as a second quantity," where the term "quantity" may refer to measured parameters such as frequency, period, pulse width, delay time, voltage, or current, etc., or specific component values, such as resistance, capacitance, length, width, area, or ratios of the above quantities, etc. It is understood that such statements are intended to mean the two quantities are equal, or the same, subject to measurement and manufacturing limits, which may include built-in variations.

In the embodiment of FIG. 3, pulse skipping circuit 300 includes a first D-flipflop 311, a first inverter 312, a first Schmitt trigger 313, and a first AND gate 314. The first D-flipflop 311 has a data input terminal D for receiving a first data input D1, an output terminal Q for producing a first data output Q1, and a clock input terminal CK coupled to the input node 301 for receiving the input clock pulse signal CLK from the input node 301. In this example, the first D-flipflop 311 is a set-reset D-flipflop that further includes a reset terminal "rb" for receiving a first reset signal "resetb1," and a set terminal "set" for receiving a first set signal "set1."

In pulse skipping circuit 300, the first inverter 312 couples the output terminal Q of the first D-flipflop 311 and the data input terminal D of the first D-flipflop 311. The first Schmitt trigger 313 is configured for receiving the input clock pulse signal CLK from the input node 301 and providing a first delayed input clock signal "ckd1." The first AND gate 314 receives the first data output Q1 of the first D-flipflop 311 and the first delayed input clock signal "ckd1" from the first Schmitt trigger 313, and provides the first output pulse signal OUT1.

The first Schmitt trigger 313 is a buffer with hysteresis and two thresholds configured to reduce input signal noise effect.

FIG. 4 is a waveform diagram illustrating the operation of pulse skipping circuit 300 in FIG. 3, according to some embodiments of the invention. In the example shown in FIG. 4, the horizontal axis is time in microseconds (μs), and the vertical axes show voltage of the clock signal (CLK) 401, output signal (OUT) 402, and the data output signal (Q1) 403 of the D-flipflop in Volts (V). As shown in FIG. 4, input clock pulse signal CLK is characterized by a first period T1, a first frequency (1/T1, where T1 is a first period), and a first pulse width W1. The first output pulse signal OUT1 is characterized by a second frequency (1/T2, where T2 is a second period) that is half of the first frequency (1/T1) and a second pulse width W2 that is equal to the first pulse width W1. FIG. 4 also shows the first data output Q1 of the first D-flipflop 311. The first data output Q1 is characterized by a frequency that is half of the first frequency (1/T1) and a pulse width that is twice the first pulse width W1.

It can be seen that pulse skipping circuit 300 in FIG. 3 can be used to generate a clock signal that is characterized by a frequency that is half of the first frequency (1/T1) and a pulse width that is equal to the first pulse width W1. An application of pulse skipping circuit 300 in FIG. 3 is illustrated in FIGS. 5 and 6.

Figure 5:
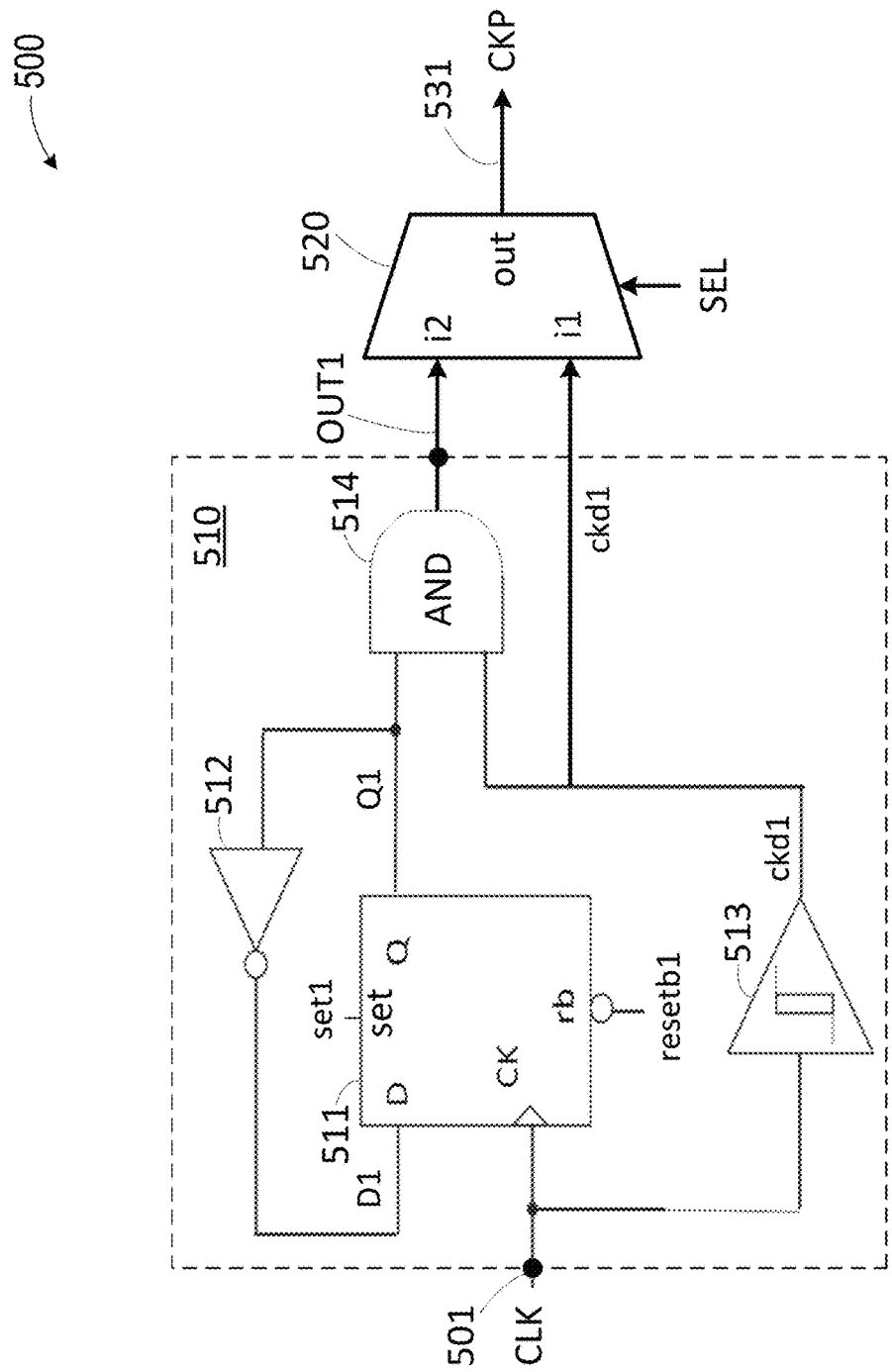
FIG. 5 is a simplified schematic diagram of a dual-mode clock circuit according to some embodiments of the invention.
Figure 6:
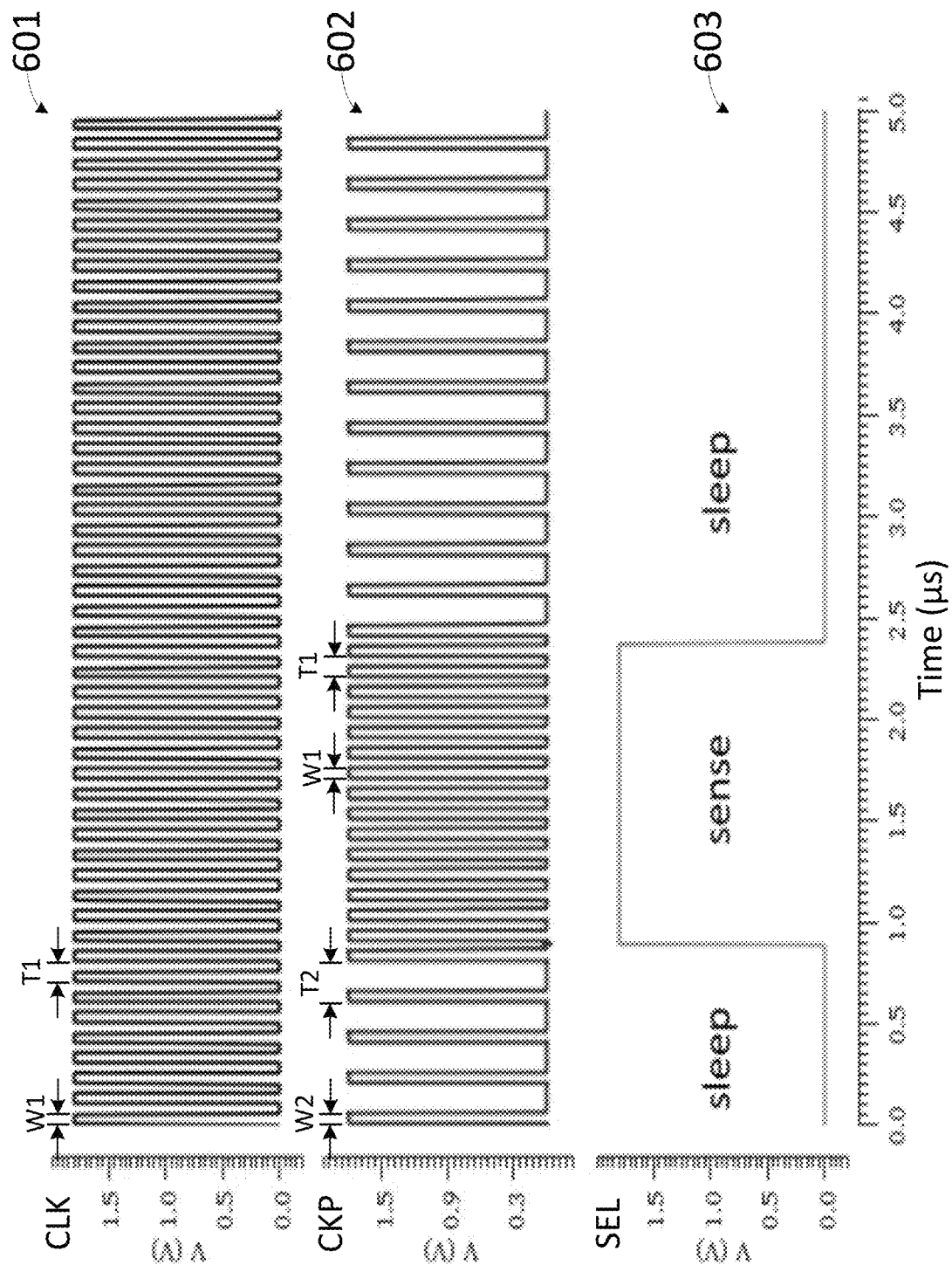
FIG. 6 is a waveform diagram illustrating the operation of the dual-mode clock circuit in FIG. 5, according to some embodiments of the invention.

FIG. 5 is a simplified schematic diagram of a dual-mode clock circuit according to some embodiments of the invention. The operation of dual-mode clock circuit 500 in FIG. 5 is explained with reference to the waveform diagram in FIG. 6. As shown in FIG. 5, a dual-mode clock circuit 500 includes an input node 501 for receiving an input clock pulse signal CLK characterized by a first frequency (1/T1, where T1 is a first period), and a first pulse width W1. Multi-mode clock circuit 500 includes a clock output node 531 "out" for providing a dual-mode clock pulse signal CKP in response to a select signal SEL, which can be in a first state, e.g., "0," or a second state, e.g., "1." In some embodiments, if the select signal SEL is in the first state, the dual-mode clock pulse signal CKP is characterized by the first frequency (1/T1, where T1 is a first period), and the first pulse width W1. If the select signal SEL is in the second state, the dual-mode clock pulse signal CKP is characterized by a second clock frequency (1/T2, where T2 is a second period) that is half the first frequency, and a second clock pulse width that is equal to the first pulse width W2.

As shown in FIG. 5, dual-mode clock circuit 500 includes a first pulse skipping circuit 510 for producing a first output clock pulse signal OUT1. In some embodiments, the first pulse skipping circuit 510 is similar to the first pulse skipping circuit 300. As shown in FIG. 5, the first pulse skipping circuit 510 includes a first D-flipflop 511 having a data input terminal D for receiving a first data input D1, an output terminal Q for producing a first data output Q1, a reset terminal "rb" for receiving a first reset signal "resetb1," a set terminal "set" for receiving a first set signal "set1," and a clock input terminal CK coupled to the input node 501 for receiving the input clock pulse signal CLK from the input node 501. The first pulse skipping circuit 510 also includes a first inverter 512 coupling the output terminal Q of the first D-flipflop 511 and the data input terminal D of the first D-flipflop 511. The first pulse skipping circuit 510 also includes a first Schmitt trigger 513 for receiving the input clock pulse signal CLK from the input node 501 and providing a first delayed input clock signal "ckd1." The first pulse skipping circuit 510 further includes a first AND gate 514 for receiving the first data output Q1 of the first D flipflop 511 and the first delayed input clock signal "ckd1" from the Schmitt trigger 513, and providing the first output clock pulse signal OUT1.

Dual-mode clock circuit 500 also includes a multiplexer 520 having a first input "i1" for receiving the first delayed input clock signal "ckd1" from the Schmitt trigger 513, a second input "i2" for receiving the first output clock pulse signal OUT1, and an output "out" for providing the dual-mode clock pulse signal CKP in response to a select signal SEL. If the select signal SEL is in a first state, the dual-mode clock pulse signal CKP is characterized by the first frequency (1/T1, where T1 is a first period), and the first pulse width W1. If the select signal SEL is in a second state, the dual-mode clock pulse signal CKP is characterized by a second clock frequency (1/T2, where T2 is a second period) that is half the first frequency, and a second clock pulse width W2 that is equal to the first pulse width W1. In some embodiments, when the select signal SEL is in the first state, the circuit is in an active state, and when the select signal SEL is in the second state, the circuit is in a sleep state.

In dual-mode clock circuit 500, the first Schmitt trigger 513 provides hysteresis and two thresholds configured to reduce noise effect in the input signal, which may be caused by transient or unstable conditions.

FIG. 6 is a waveform diagram illustrating the operation of dual-mode clock circuit 500 in FIG. 5, according to some embodiments of the invention. In the example shown in FIG. 6, the horizontal axis is time in microseconds (μs), and the vertical axes show voltage of the clock signal (CLK) 601, the dual-mode clock pulse signal (CKP) 602, and the select signal (SEL) 603. As shown in FIG. 6, input clock pulse signal CLK is characterized by a first period T1, a first frequency (1/T1, where T1 is a first period), and a first pulse width W1. The dual-mode clock pulse signal (CKP) is characterized by a second frequency (1/T2, where T2 is a second period) that is half of the first frequency (1/T1) and a second pulse width W2 that is equal to the first pulse width W1. The second period T2 is twice the length as the first period T1. FIG. 6 also shows the voltage 603 of the select signal SEL indicating two states, "sense" and "sleep." In other embodiments, the select signal SEL can indicate two states, "active" and "sleep."

Figure 7:
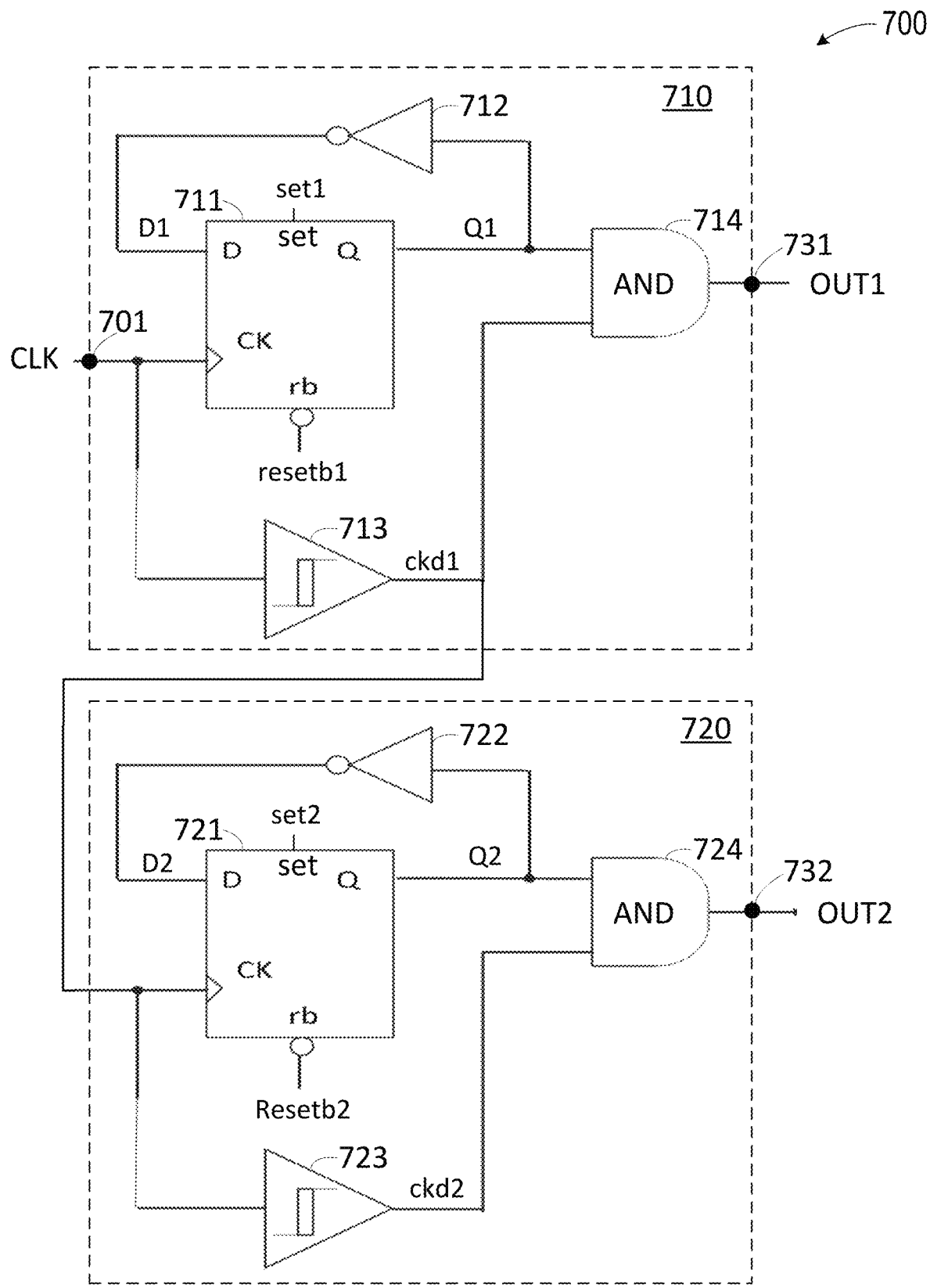
FIG. 7 is a simplified schematic diagram of a non-overlapping clock circuit according to some embodiments of the invention.

FIG. 7 is a simplified schematic diagram of a non-overlapping clock circuit according to some embodiments of the invention. As shown in FIG. 7, non-overlapping clock circuit 700 includes an input node 701 for receiving an input clock pulse signal CLK, a first output node 731 for providing a first output clock pulse signal OUT1, and a second output node 732 for providing a second output clock pulse signal OUT2. The first output clock pulse signal OUT1 and the second output pulse signal OUT2 are non-overlapping signals.

In the example of FIG. 7, non-overlapping clock circuit 700 includes two pulse skipping circuits. A first pulse skipping circuit 710 is configured for producing the first output clock pulse signal OUT1, and includes a first D-flipflop 711 having a data input terminal D for receiving a first data input D1, an output terminal Q for producing a first data output Q1, a reset terminal "rb" for receiving a first reset signal "resetb1," a set terminal "set" for receiving a first set signal "set1," and a clock input terminal CK coupled to the input node 701 for receiving the input clock pulse signal CLK from the input node 701. A first inverter 712 couples the output terminal Q of the first D-flipflop 711 and the data input terminal D of the first D-flipflop 711. A first Schmitt trigger 713 receives the input clock pulse signal CLK from the input node 701 and provides a first delayed input clock signal "ckd1." A first AND gate 714 receives the first data output Q1 of the first D-flipflop 711 and the first delayed input clock signal "ckd1" from the Schmitt trigger 713, and provides the first output clock pulse signal OUT1.

Figure 8:
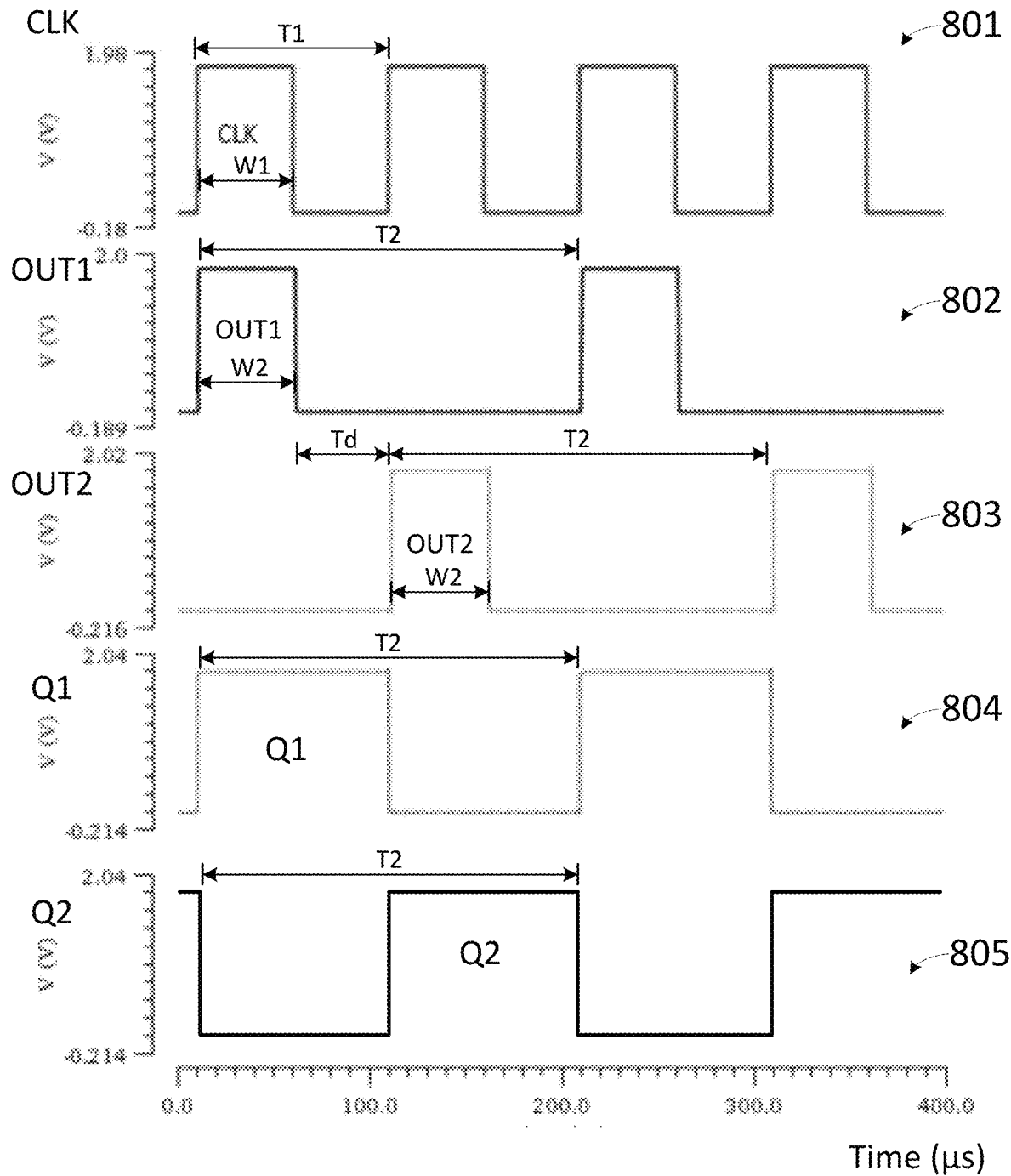
FIG. 8 is a waveform diagram illustrating the operation of the non-overlapping clock circuit in FIG. 7, according to some embodiments of the invention.

A second pulse skipping circuit 720 is configured for producing the second output pulse signal OUT2, and includes a second D-flipflop 721 having a data input terminal D for receiving a second data input data D2, an output terminal Q for producing a second data output Q2, a reset terminal "rb" for receiving a second reset signal "resetb2," a set terminal "set" for receiving a second set signal "set2," and a clock input terminal CK coupled to the first Schmitt trigger 713 for receiving the first delayed input clock signal "ckd1." A second inverter 722 couples the output terminal Q of the second D-flipflop 721 and the data input terminal D of the second D-flipflop 721. A second Schmitt trigger 723 receives the first delayed input clock signal "ckd1" from the first Schmitt trigger 713 and provides a second delayed input clock pulse signal "ckd2." A second AND gate 724 receives the output signal Q2 of the second D-flipflop 721 and the second delayed input clock signal "ckd2" from the second Schmitt trigger 721, and provides the second output pulse signal OUT2. As illustrated in FIG. 8, the first output pulse signal OUT1 and the second output pulse signal OUT2 are non-overlapping signals. The initial states for D-flipflops 711 and 721 are characterized in opposite values. Hence, if Q1 is reset to "0", then Q1 is set to "1."

FIG. 8 is a waveform diagram illustrating the operation of non-overlapping clock circuit 700 in FIG. 7, according to some embodiments of the invention. In the example shown in FIG. 8, the horizontal axis is time in microseconds (μs), and the vertical axes show voltage of the clock signal CLK (801), the first output clock pulse signal OUT1 (802), the second output clock pulse signal OUT2 (803), the first data output Q1 (804) of the first D-flipflop 711, and the second data output Q2 (805) of the second D-flipflop 721.

As shown in FIG. 8, input clock pulse signal CLK is characterized by a first period T1, a first frequency (1/T1, where T1 is a first period), and a first pulse width W1. The first output clock pulse signal OUT1 by a second frequency (1/T2, where T2 is a second period) is half of the first frequency (1/T1) and a second pulse width W2 is equal to the first pulse width W1. The second period T2 is twice the length of the first period T1. The second output clock pulse signal OUT2 by a second frequency (1/T2, where T2 is a second period) is half of the first frequency (1/T1) and a second pulse width W2 is equal to the first pulse width W1. A delay time Td between consecutive first output pulse signal OUT1 and second output pulse signal OUT2 is equal to the first pulse width W1. Further, it can be seen in FIG. 8 that the first output pulse signal OUT1 and the second output pulse signal OUT2 are aligned with alternate input clock pulse signal CLK.

In the non-overlapping clock circuit 700 in FIG. 7, the first D-flipflop 711 and the second D-flipflop 721 are configured such that the first data output Q1 of the first D-flipflop 711 and the second data output Q2 of the second D-flipflop 721 are characterized by opposite logic states. As shown in FIGS. 8, Q1 and Q2 are both characterized by a period of T2 and opposite logic states. In some embodiments, the first reset signal "resetb1" is set to low to set the first data output Q1 of the first D-flipflop 711 to low, and the second set signal "set2" is set to high to set the second data output Q2 of the second D-flipflop 721 to high.

Certain embodiments have been described. However, various modifications to these embodiments are possible, and the principles presented herein may be applied to other embodiments as well. In addition, the various components and/or method steps/blocks may be implemented in arrangements other than those specifically disclosed without departing from the scope of the claims. Other embodiments and modifications will occur readily to those of ordinary skill in the art in view of these teachings. Therefore, the following claims are intended to cover all such embodiments and modifications when viewed in conjunction with the above specification and accompanying drawings.

What is claimed is:

1. A circuit, comprising a first pulse skipping circuit for producing a first output pulse signal, wherein the first pulse skipping circuit includes:
    an input node for receiving an input clock pulse signal characterized by a first frequency and a first pulse width;
    a first output node for providing a first output pulse signal characterized by a second frequency that is half of the first frequency and a second pulse width that is equal to the first pulse width;
    a first D-flipflop having a data input terminal for receiving a first data input, an output terminal for producing a first data output, and a clock input terminal coupled to the input node for receiving the input clock pulse signal from the input node;
    a first inverter coupling the output terminal of the first D-flipflop and the data input terminal of the first D-flipflop;
    a first Schmitt trigger for receiving the input clock pulse signal from the input node and providing a first delayed input clock signal; and
    a first AND gate for receiving the first data output of the first D-flipflop and the first delayed input clock signal from the first Schmitt trigger, and providing the first output pulse signal.

2. The circuit of claim 1, wherein the first D-flipflop is a set-reset D-flipflop that further comprises a reset terminal for receiving a first reset signal, a set terminal for receiving a first set signal.

3. The circuit of claim 1, wherein the first Schmitt trigger comprises a hysteresis and two thresholds configured to reduce input signal noise effect.

4. The circuit of claim 1, wherein the first data output is characterized by a frequency that is half of the first frequency and a pulse width that is twice the first pulse width.

5. The circuit of claim 1, further comprising:
    a multiplexer, including:
    a first input for receiving the first delayed input clock signal from the first Schmitt trigger;
    a second input for receiving the first output pulse signal; and
    an output for providing a dual-mode clock pulse signal in response to a select signal;
    wherein:
    if the select signal is in a first state, the dual-mode clock pulse signal is characterized by the first frequency, and the first pulse width; and
    if the select signal is in a second state, the dual-mode clock pulse signal is characterized by a second clock frequency that is half the first frequency, and a second clock pulse width that is equal to the first pulse width.

6. The circuit of claim 5, wherein, when the select signal is in the first state, the circuit is in an active state, and, when the select signal is in the second state, the circuit is in a sleep state.

7. The circuit of claim 1, further comprising:
    a second pulse skipping circuit for producing a second output pulse signal, comprising:
    a second D-flipflop having a data input terminal for receiving a second data input data, an output terminal Q for producing a second data output, and a clock input terminal coupled to the first Schmitt trigger for receiving the first delayed input clock signal;
    a second inverter coupling the output terminal of the second D-flipflop and the data input terminal of the second D-flipflop;
    a second Schmitt trigger for receiving the first delayed input clock signal from the first Schmitt trigger and providing a second delayed input clock signal; and
    a second AND gate for receiving the second data output of the second D-flipflop and the second delayed input clock signal from the second Schmitt trigger, and providing the second output pulse signal;
    wherein the first D-flipflop and the second D-flipflop are configured such that the first data output of the first D-flipflop and the output of the second D-flipflop are characterized by opposite states; and
    wherein the first output pulse signal and the second output pulse signal are non overlapping signals.

8. The circuit of claim 7, wherein a delay time between a consecutive first output pulse signal and a second output pulse signal is equal to the first pulse width.

9. The circuit of claim 8, wherein the second output pulse signal is characterized by the second frequency that is half of the first frequency and the second pulse width that is equal to the first pulse width.

10. The circuit of claim 7, wherein the first output pulse signal and the second output pulse signal are synchronized with alternate input clock pulse signals, respectively.

11. A circuit, comprising:
an input node for receiving an input clock pulse signal characterized by a first frequency, and a first pulse width;
a clock output node for providing a dual-mode clock pulse signal;
a first pulse skipping circuit for producing a first output clock pulse signal, comprising:
a first D-flipflop having a data input terminal for receiving a first data input, an output terminal for producing a first data output, a reset terminal for receiving a first reset signal, a set terminal for receiving a first set signal and a clock input terminal CK coupled to the input node for receiving the input clock pulse signal from the input node;
a first inverter coupling the output terminal of the first D-flipflop and the data input terminal of the first D-flipflop;
a first Schmitt trigger for receiving the input clock pulse signal from the input node and providing a first delayed input clock signal; and
a first AND gate for receiving the first data output of the first D flipflop and the first delayed input clock signal from the Schmitt trigger, and providing the first output clock pulse signal; and
a multiplexer comprising:
a first input for receiving the first delayed input clock signal from the Schmitt trigger;
a second input for receiving the first output clock pulse signal; and
an output for providing the dual-mode clock pulse signal in response to a select signal;
wherein:
if the select signal is in a first state, the dual-mode clock pulse signal is characterized by the first frequency, and the first pulse width; and
if the select signal is in a second state, the dual-mode clock pulse signal is characterized by a second clock frequency that is half the first frequency, and a second clock pulse width that is equal to the first pulse width.

12. The circuit of claim 11, wherein the first D-flipflop is a set-reset D flipflop that further comprises a reset terminal for receiving a first reset signal, a set terminal for receiving a first set signal.

13. The circuit of claim 11, wherein the first Schmitt trigger comprises a hysteresis and two thresholds configured to reduce a noise effect in the input signal.

14. The circuit of claim 11, wherein:
when the select signal is in the first state, the circuit is in an active state; and
when the select signal is in the second state, the circuit is in a sleep state.

15. A circuit, comprising:
an input node for receiving an input clock pulse signal;
a first output node for providing a first output clock pulse signal;
a second output node for providing a second output clock pulse signal;
a first pulse skipping circuit for producing the first output clock pulse signal, comprising:
a first D-flipflop having a data input terminal for receiving a first data input, an output terminal for producing a first data output, a reset terminal for receiving a first reset signal, a set terminal for receiving a first set signal, and a clock input terminal coupled to the input node for receiving the input clock pulse signal from the input node;
a first inverter coupling the output terminal of the first D-flipflop and the data input terminal of the first D-flipflop;
a first Schmitt trigger for receiving the input clock pulse signal from the input node and providing a first delayed input clock signal; and
a first AND gate for receiving the first data output of the first D-flipflop and the first delayed input clock signal from the Schmitt trigger, and providing the first output clock pulse signal;
a second pulse skipping circuit for producing the second output pulse signal, comprising:
a second D-flipflop having a data input terminal for receiving a second data input data, an output terminal for producing a second data output, a reset terminal for receiving a second reset signal, a set terminal for receiving a second set signal, and a clock input terminal coupled to the first Schmitt trigger for receiving the first delayed input clock signal;
a second inverter coupling the output terminal of the second D-flipflop and the data input terminal D of the second D-flipflop;
a second Schmitt trigger for receiving the first delayed input clock signal from the first Schmitt trigger and providing a second delayed input clock pulse signal; and
a second AND gate for receiving the output signal of the second D-flipflop and the second delayed input clock signal from the second Schmitt trigger, and providing the second output pulse signal,
wherein the first output clock pulse signal and the second output pulse signal are non-overlapping signals.

16. The circuit of claim 15, wherein:
the input clock pulse signal is characterized by a first frequency and a first pulse width;
the first output pulse signal is characterized by a second frequency that is half of the first frequency and a second pulse width that is equal to as the first pulse width; and
the second output pulse signal is characterized by the second frequency that is half of the first frequency and the second pulse width that is equal to the first pulse width.

17. The circuit of claim 16, wherein a delay time between a consecutive first output pulse signal and a second output pulse signal is equal to the first pulse width.

18. The circuit of claim 15, wherein the first output pulse signal and the second output pulse signal are aligned with alternate input clock pulse signals.

19. The circuit of claim 15, wherein the first D-flipflop and the second D flipflop are configured such that the first data output of the first D-flipflop and the second data output of the second D-flipflop are characterized by opposite logic states.

20. The circuit of claim 15, wherein:
the first reset signal is set to high to set the first data output of the first D-flipflop to low; and
the second set signal is set to high to set the second data output of the second D flipflop to high.

* * * * *